United States Patent
Arnold et al.

(10) Patent No.: US 9,425,405 B1
(45) Date of Patent: Aug. 23, 2016

(54) CONTINUOUS, FLOATING EVAPORATIVE ASSEMBLY OF ALIGNED CARBON NANOTUBES

(71) Applicant: Wisconsin Alumni Research Foundation, Madison, WI (US)

(72) Inventors: Michael Scott Arnold, Middleton, WI (US); Harold T. Evensen, Verona, WI (US); Gerald Joseph Brady, Madison, WI (US); Padma Gopalan, Madison, WI (US); Yongho Joo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/619,465

(22) Filed: Feb. 11, 2015

(51) Int. Cl.

| | |
|---|---|
| *H01L 51/00* | (2006.01) |
| *C01B 31/02* | (2006.01) |
| *C09D 11/52* | (2014.01) |
| *C09D 11/106* | (2014.01) |
| *B05D 1/18* | (2006.01) |
| *H01L 29/06* | (2006.01) |
| *H01L 29/78* | (2006.01) |

(52) U.S. Cl.
CPC ............ *H01L 51/0048* (2013.01); *B05D 1/18* (2013.01); *C01B 31/0226* (2013.01); *C09D 11/106* (2013.01); *C09D 11/52* (2013.01); *H01L 29/0669* (2013.01); *H01L 29/78* (2013.01); *C01B 2202/02* (2013.01)

(58) Field of Classification Search
CPC ........... H01L 51/0003; H01L 51/0048; H01L 51/0075; H01L 21/02628; H01L 21/02527; H01L 21/02606; H01L 29/267; H01L 51/8611; H01L 29/66136
See application file for complete search history.

(56) References Cited

U.S. PATENT DOCUMENTS

| | | | |
|---|---|---|---|
| 7,226,818 | B2 | 6/2007 | Malenfant et al. |
| 7,875,320 | B2 | 1/2011 | Park et al. |
| 8,313,795 | B2 | 11/2012 | Kadono |
| 8,455,055 | B1 | 6/2013 | Humfeld |
| 2003/0180472 | A1 | 9/2003 | Zhou et al. |
| 2006/0081882 | A1 | 4/2006 | Malenfant et al. |
| 2007/0246784 | A1* | 10/2007 | Kang ............... B82Y 10/00 257/407 |
| 2008/0199626 | A1 | 8/2008 | Zhou et al. |
| 2008/0296563 | A1 | 12/2008 | Bourgoin et al. |
| 2009/0214816 | A1 | 8/2009 | Hata et al. |
| 2009/0267060 | A1 | 10/2009 | Forrest et al. |
| 2010/0065829 | A1 | 3/2010 | Forrest et al. |

(Continued)

OTHER PUBLICATIONS

Shastry et aL, Large-area, electronically monodisperse, aligned single-walled carbon nanotube thin films fabricated by evaporation-driven self-assembly, Small, vol. 9, Sep. 17, 2012, pp. 45-51.

(Continued)

*Primary Examiner* — Kyoung Lee
(74) *Attorney, Agent, or Firm* — Bell & Manning, LLC

(57) ABSTRACT

High density films of semiconducting single-walled carbon nanotubes having a high degree of nanotube alignment are provided. Also provided are methods of making the films and field effect transistors (FETs) that incorporate the films as conducting channel materials. The single-walled carbon nanotubes are deposited from a thin layer of organic solvent containing solubilized single-walled carbon nanotubes that is continuously supplied to the surface of an aqueous medium, inducing evaporative self-assembly upon contacting a solid substrate.

17 Claims, 5 Drawing Sheets

(56) References Cited

U.S. PATENT DOCUMENTS

2010/0127242 A1 5/2010 Zhou et al.
2010/0233360 A1 9/2010 Lee et al.
2010/0247381 A1 9/2010 Yodh et al.
2014/0342098 A1 11/2014 Curran et al.

OTHER PUBLICATIONS

Lemieux et al., Self-sorted, aligned nanotube networks for thin-film transistors, Science, vol. 321, Jul. 4, 2008, pp. 101-104.
Cao et al., Arrays of single-walled carbon nanotubes with full surface coverage for high-performance electronics, Nat. Nanotechnol., vol. 8, Jan. 27, 2013, pp. 180-186.
Shekhar et al., Ultrahigh density alignment of carbon nanotube arrays by dielectrophoresis, ACS Nano, vol. 5, Feb. 16, 2011, pp. 1739-1746.
Engel et al., Thin Film Nanotube Transistors Based on Self-Assembled, Aligned, Semiconducting Carbon Nanotube Arrays, ACS Nano, vol. 2, Dec. 9, 2008, pp. 2445-2452.
Hong et al., Improved Density in Aligned Arrays of Single-Walled Carbon Nanotubes by Sequential Chemical Vapor Deposition on Quartz, Adv. Mater., vol. 22, Jan. 7, 2010, pp. 1826-1830.
Sangwan et al., Fundamental Performance Limits of Carbon Nanotube Thin-Film Transistors Achieved Using Hybrid Molecular Dielectrics, ACS Nano, vol. 6, No. 8 , Jul. 11, 2012, pp. 7480-7488.
Miyata et al., Length-sorted semiconducting carbon nanotubes for high-mobility thin film transistors, Nano. Research, vol. 4, No. 10, Oct. 2011, pp. 963-970.
Kang et al., High-performance electronics using dense, perfectly aligned arrays of single-walled carbon nanotubes, Nat. Nanotechnol., vol. 2, No. 4, Mar. 25, 2007, pp. 230-236.
Jin et al., Using nanoscale thermocapillary flows to create arrays of purely semiconducting single-walled carbon nanotubes , Nat. Nanotechnol., vol. 8, No. 5, Apr. 28, 2013, pp. 347-355.
Sun et al., Flexible high-performance carbon nanotube integrated circuits, Nat. Nanotechnol., vol. 6, No. 3, Feb. 6, 2011, pp. 156-161.
Kim et al., Low voltage, high performance inkjet printed carbon nanotube transistors with solution processed $ZrO_2$ gate insulator, App. Phys. Lett., vol. 103, No. 8, Aug. 23, 2013, pp. 082119-1-082119-4.
Wu et al., Self-Assembly of Semiconducting Single-Walled Carbon Nanotubes into Dense, Aligned Rafts, Small, Jul. 11, 2013, vol. 9, No. 24, pp. 4142-4148.
Ma et al., The production of horizontally aligned single-walled carbon nanotubes, Carbon, vol. 49, Jun. 24, 2011, pp. 4098-4110.
Mistry et al., High-Yield Dispersions of Large-Diameter Semiconducting Single-Walled Carbon Nanotubes with Tunable Narrow Chirality Distributions, ACS Nano, vol. 7. No. 3, Feb. 4, 2013, pp. 2231-2239.
Qian et al., Electrical and Photoresponse Properties of Printed Thin-Film Transistors Based on Poly(9,9-dioctylfluorene-co-bithiophene) Sorted Large-Diameter Semiconducting Carbon Nanotubes, J. Phys. Chem. C, vol. 117, Aug. 8, 2013, pp. 18243-18250.
Joo et al., "Dose-controlled, floating evaporative self-assembly and alignment of semiconducting carbon nanotubes from organic solvents," *Langmuir*, Mar. 2, 2014, vol. 30, pp. 3460-3466.
International Search Report and Written Opinion issued for Intl. Patent Appl. No. PCT/US2015/015342, mailed on May 22, 2015, 10 pp.
Non-Final Office Action issued for U.S. Appl. No. 14/177,828, mailed on Aug. 27, 2015, 16 pp.

\* cited by examiner

CONTINUOUS, FLOATING EVAPORATIVE ASSEMBLY OF ALIGNED CARBON NANOTUBES

BACKGROUND

Single-walled carbon nanotubes (SWCNTs) are key building blocks for nanoscale science and technology due to their interesting physical and chemical properties. SWCNTs are particularly promising for high speed and low power semiconductor electronics. A challenge, however, is the hierarchical organization of these building blocks into organized assemblies and, ultimately, useful devices. Ordered structures are necessary, as random network SWCNT thin films result in sub-optimal electronic properties including reduced channel conductance and mobility. Numerous techniques for aligning SWCNTs have been explored to solve this shortcoming and achieve higher conductance and mobility. These approaches can be divided into two main categories: (a) direct growth via chemical vapor deposition and arc-discharge, and (b) post synthetic assembly. In the case of direct growth, both metallic and semiconducting SWCNTs are produced. In this case, the performance of SWCNT field effect transistors (FETs) is limited by the metallic SWCNTs (m-SWCNTs), thus motivating attempts to purify semiconducting SWCNT (s-SWCNT) samples with homogeneous electronic properties.

A variety of post-synthetic sorting methods have been developed to separate m- and s-SWCNTs according to their specific physical and electronic structures, which are usually implemented in aqueous or organic solutions. In order to take advantage of the high purity of s-SWCNTs that can be produced by these solution-based sorting approaches in semiconductor electronic devices, solution-based methods for assembling and aligning s-SWCNTs, such as evaporation-driven self-assembly, blown-bubble assembly, gas flow self-assembly, spin-coating, Langmuir-Blodgett and -Shafer methods, contact-printing assembly, and AC electrophoresis, have been developed. (See, Shastry, T. A.; Seo, J. W.; Lopez, J. J.; Arnold, H. N.; Kelter, J. Z.; Sangwan, V. K.; Lauhon, L. J.; Marks, T. J.; Hersam, M. C. Large-area, electronically monodisperse, aligned single-walled carbon nanotube thin films fabricated by evaporation-driven self-assembly. *Small* 2013, 9, 45-51; Druzhinina, T.; Hoeppener, S.; Schubert, U. S. Strategies for Post-Synthesis Alignment and Immobilization of Carbon Nanotubes. *Adv. Mater.* 2011, 23, 953-970; Yu, G.; Cao, A.; Lieber, C. M. Large-area blown bubble films of aligned nanowires and carbon nanotubes. *Nat. Nanotechnol.* 2007, 2, 372-7; Wu, J.; Jiao, L.; Antaris, A.; Choi, C. L.; Xie, L.; Wu, Y.; Diao, S.; Chen, C.; Chen, Y.; Dai, H. Self-Assembly of Semiconducting Single-Walled Carbon Nanotubes into Dense, Aligned Rafts. *Small* 2013, 9, 4142; LeMieux, M. C.; Roberts, M.; Barman, S.; Jin, Y. W.; Kim, J. M.; Bao, Z. Self-sorted, aligned nanotube networks for thin-film transistors. *Science* 2008, 321, 101-4; Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6; Jia, L.; Zhang, Y.; Li, J.; You, C.; Xie, E. Aligned single-walled carbon nanotubes by Langmuir-Blodgett technique. *J. Appl. Phys.* 2008, 104, 074318; Liu, H.; Takagi, D.; Chiashi, S.; Homma, Y. Transfer and alignment of random single-walled carbon nanotube films by contact printing. *ACS Nano* 2010, 4, 933-8 and Shekhar, S.; Stokes, P.; Khondaker, S. I. Ultrahigh density alignment of carbon nanotube arrays by dielectrophoresis. *ACS Nano* 2011, 5, 1739-46.) While each of these methods has its strengths, new methods are still needed to improve the fidelity of s-SWCNT assembly and alignment in order to enable the fabrication of practical s-SWCNT-based electronic devices.

SUMMARY

High density films of s-SWCNTs having a high degree of nanotube alignment are provided. Also provided are methods of making the films and field effect transistors that incorporate the films as conducting channel materials.

One embodiment of a method of forming a film of aligned s-SWCNTs on a substrate includes the steps of: (a) partially submerging a hydrophobic substrate in an aqueous medium; (b) supplying a continuous flow of a liquid solution to the aqueous medium, the liquid solution comprising semiconductor-selective-polymer-wrapped s-SWCNTs dispersed in an organic solvent, whereby the liquid solution spreads into a layer on the aqueous medium at an air-liquid interface and semiconductor-selective-polymer-wrapped s-SWCNTs from the layer are deposited as a film of aligned semiconductor-selective-polymer-wrapped s-SWCNTs on the hydrophobic substrate, wherein the organic solvent in the layer, which is continuously evaporating, is also continuously resupplied by the flow of liquid solution during the formation of the film; and (c) withdrawing the hydrophobic substrate from the aqueous medium, such that the film of aligned semiconductor-selective-polymer-wrapped s-SWCNTs is grown along the length of the hydrophobic substrate as it is withdrawn from the aqueous medium.

An embodiment of a film comprising aligned s-SWCNTs, can be characterized in that the s-SWCNTs in the film have a degree of alignment of about ±20° or better and the single-walled carbon nanotube linear packing density in the film is at least 40 single-walled carbon nanotubes/µm. In some embodiments, the films have a semiconducting single-walled carbon nanotube purity level of at least 99.9%.

An embodiment of a field effect transistor includes: a source electrode; a drain electrode; a gate electrode; a conducting channel in electrical contact with the source electrode and the drain electrode, the conducting channel comprising a film comprising aligned s-SWCNTs, wherein the s-SWCNTs in the film have a degree of alignment of about ±20° or better and the single-walled carbon nanotube linear packing density in the film is at least 40 single-walled carbon nanotubes/µm; and a gate dielectric disposed between the gate electrode and the conducting channel. Some embodiments of the transistors have an on-conductance per width of at least 5 µS µm$^{-1}$ and an on/off ratio per width of at least 1×10$^5$.

Other principal features and advantages of the invention will become apparent to those skilled in the art upon review of the following drawings, the detailed description, and the appended claims.

DETAILED DESCRIPTION

High density films of s-SWCNTs having a high degree of nanotube alignment are provided. Also provided are methods of making the films and field effect transistors that incorporate the films as conducting channel materials.

The films are formed using a method referred to in this disclosure as "continuous, floating evaporative self-assembly" (continuous FESA). This method uses a thin layer of a solution of organic solvent containing solubilized s-SWCNTs at an air-liquid interface to deposit films of aligned s-SWCNTs on a partially submerged hydrophobic substrate. The methods decouple the s-SWCNT film formation from the evaporation of a bulk liquid medium and allow for the rapid deposition of a continuous film of aligned s-SWCNTs characterized by a high degree of s-SWCNT alignment and high s-SWCNT densities. As a result, the films are well suited for use as channel materials in FETs having high on-conductance values and high on/off ratios.

In the methods the solutions of the s-SWCNTs are continuously supplied into a spreading and evaporating puddle of an organic solvent on the surface of a bulk liquid medium. Where the puddle meets the surface of the hydrophobic substrate, it forms a macroscopically stable, steady state meniscus on the surface and s-SWCNTs in the puddle migrate to the surface of the hydrophobic substrate where they form a thin film. The supply of the solution of the s-SWCNTs is "continuous" in the sense that the flow of the solution onto the liquid medium continues during the film growth process from its initiation until the film is substantially complete, such that the puddle on the bulk liquid, which is continuously evaporating, is also continuously resupplied throughout the film growth process. Without intending to be bound to any particular theory of the invention, the inventors believe that once the initial puddle of s-SWCNT solution is formed, subsequently added solution being introduced via the continuous flow does not interact with the surface of the underlying bulk liquid and, therefore, hydrodynamic flow is established in the puddle.

An advantage of the continuous, floating evaporative self-assembly method is that it allows for the deposition of s-SWCNTs with exceptional electronic-type purity (pre-sorted using semiconductor-selective polymers) in organic solvents. Unlike anionic surfactants, which have been used to sort s-SWCNTs in aqueous solution, semiconductor-selective polymers are advantageous because they can sensitively and selectively "pick out" semiconducting nanotubes directly during dispersion from raw SWCNT powders, thereby avoiding the need for subsequent post-dispersion sorting.

Figure 1:
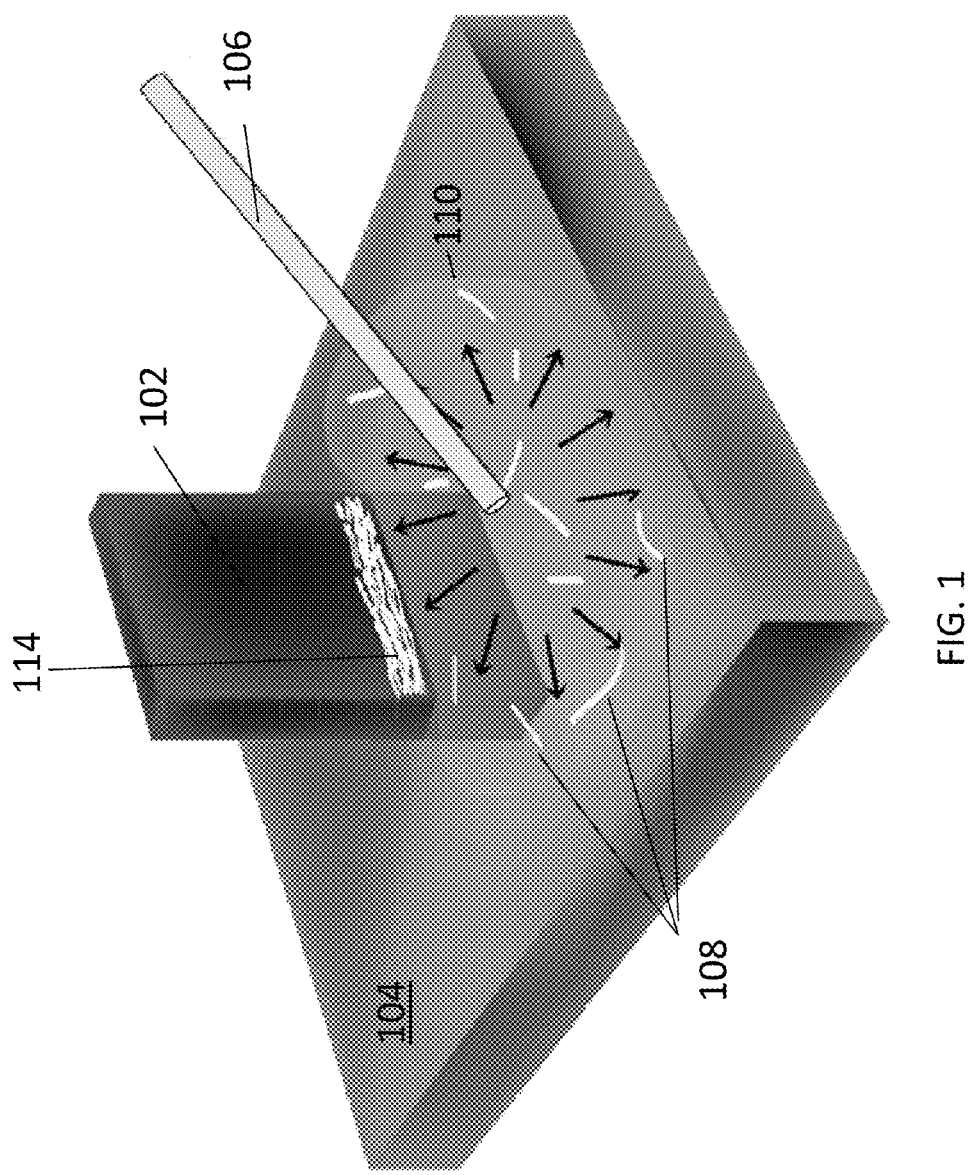
FIG. 1. A schematic illustration of an embodiment of a method of forming an aligned s-SWCNT film on the surface of a substrate.

An embodiment of the continuous, floating evaporative self-assembly method is illustrated schematically in FIG. 1. As shown in the figure, the method begins with a hydrophobic substrate 102 partially submerged in an aqueous liquid medium 104, such as water. A continuous flow of liquid solution from, for example, a syringe 106 in contact with the surface of liquid medium 104, is directed onto liquid medium 104, preferably in close proximity to substrate 102. The liquid solution, which is also referred to herein as an "organic ink" or an "s-SWCNT ink", comprises s-SWCNTs 108 dispersed in an organic solvent. The s-SW-CNTs have a semiconductor-selective polymer coated on their surfaces and are referred to herein as "semiconductor-selective-polymer-wrapped" s-SWCNTs. The liquid solution spreads (represented by solid arrows in the figure) into a thin layer (a puddle 110) over the surface of aqueous liquid medium 104 at the air-liquid interface. Driven by diffusion, semiconductor-selective-polymer-wrapped s-SWCNTs 108 in puddle 110 come into contact with and deposit onto hydrophobic substrate 102 as a film 112 of aligned s-SW-CNTs near the air-liquid interface. As organic solvent in puddle 110 continuously evaporates and is continuously replenished by the continuous flow of the s-SWCNT ink from syringe 106, ink puddle 110 reaches a steady state in which the solution flow rate and the solvent evaporation rate are equal or substantially equal. Deposited film 112 spans the width of the substrate.

Once the growth of film 112 has been initiated, substrate 108 can be elevated such that the top of the continuously growing film is withdrawn from the air-liquid interface, allowing the film to continue growing along the length of the substrate as it is withdrawn. The liquid solution can be added continuously until a film of the aligned s-SWCNTs having a desired length has been growth. Using this process, very thin films of s-SWCNTs—typically having a thickness of only a monolayer or a bilayer of s-SWNCTs—can be deposited.

Figure 2:
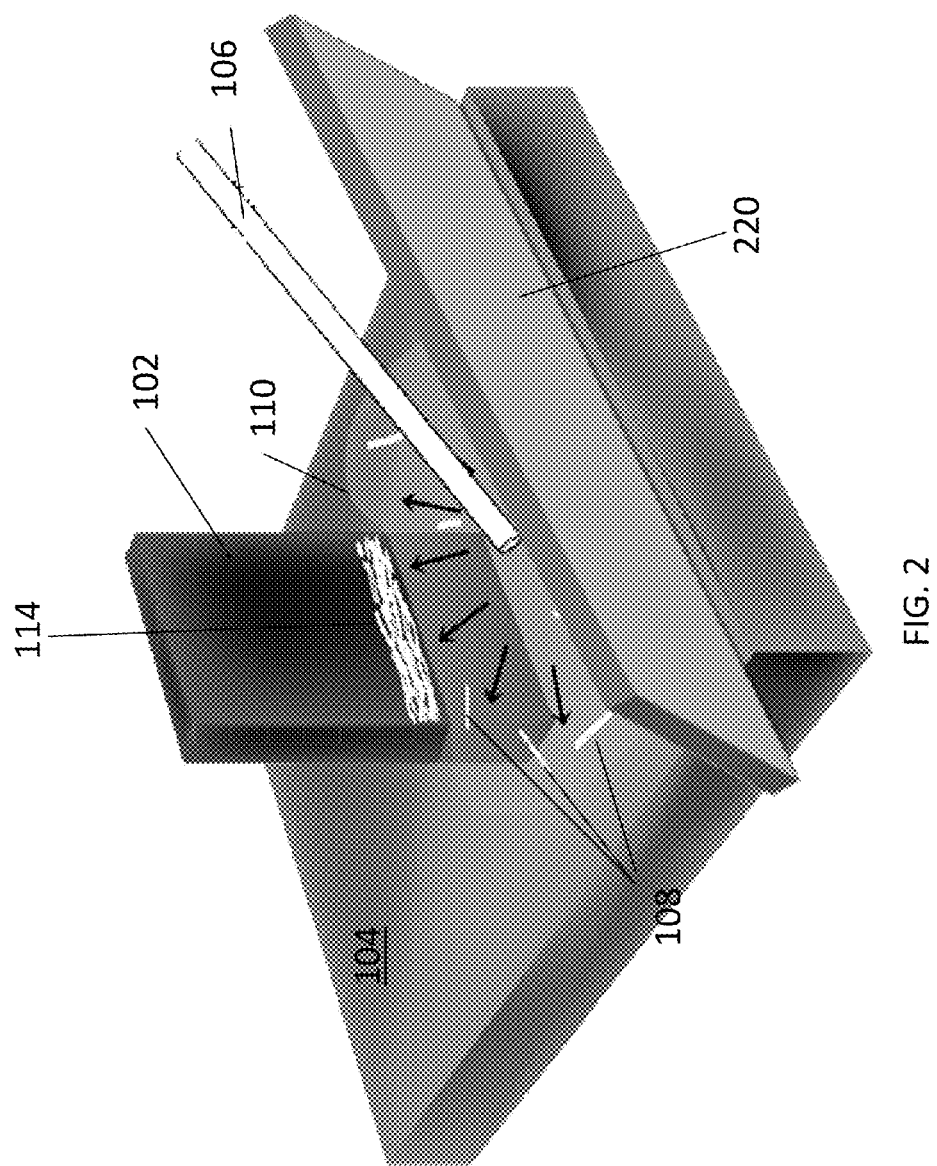
FIG. 2. A schematic illustration of another embodiment of a method of forming an aligned s-SWCNT film on the surface of a substrate.

Another embodiment of the continuous, floating evaporative self-assembly method is illustrated schematically in FIG. 2. This method is the same as that depicted in FIG. 1, except that a physical barrier (a dam) 220 is partially submerged in liquid medium 104 opposite syringe 106 in order to confine the outward flow of puddle 110.

Optionally, the semiconductor-selective polymer can be partially or entirely removed from the deposited s-SWCNTs after film formation. This can be accomplished, for example, using a polymer-selective dry or wet chemical etchant or through selective thermal decomposition of the polymer. In some embodiments of the methods, the amount of semiconductor-selective polymer on the s-SWCNTs can be reduced prior to adding them to the organic solution.

By controlling the velocity of the withdrawal of substrate 108, the film length (i.e., the dimension of the film that runs parallel to the direction of withdrawal) and s-SWCNT density along the length of the film can be carefully controlled. The optimal substrate withdrawal rate can depend on a variety of factors, including the desired characteristics of the final deposited films, the nature of the substrate and/or the concentration of s-SWCNTs in the organic solution. The present methods are able to deposit films over a large substrate surface area rapidly, even at room temperature (about 23° C.) and atmospheric pressure. For example, in some embodiments, the methods deposit films of aligned s-SWCNTs at a substrate withdrawal rate of at least 1 mm/min. This includes embodiments in which the substrate withdrawal rate is at least 5 mm/min. By way of illustration, using such high withdrawal rates, the present methods are able to deposit a continuous film of aligned s-SWCNTs over the entire surface of a 12 inch wafer (e.g., Si wafer) in less than one hour.

The density of SWCNTs in the films refers to their linear packing density, which can be quantified in terms of the number of SWCNTs per µm and measured as described in Joo et al., Langmuir, 2014, 30(12), pp. 3460-3466 ("Joo et al."). In some embodiments, the continuous, floating evaporative self-assembly method deposits films having a SWCNT density of at least 30 SWCNTs/µm. This includes embodiments in which the films have a SWCNT density of at least 35 SWCNTs/µm, at least 40 SWCNTs/µm, at least 45 SWCNTs/µm and at least about 50 SWCNTs/µm.

The degree of alignment of the SWCNTs in the films refers to their degree of alignment along their longitudinal axes within a film, which can be quantified as described in Joo et al. In some embodiments, the continuous, floating evaporative self-assembly deposits films having a SWCNT degree of alignment of ±20° or better. This includes embodiments in which the SWCNTs have a degree of alignment of ±17° or better, further includes embodiments in which the SWCNTs have a degree of alignment of ±15° or better and still further includes embodiments in which the SWCNTs have a degree of alignment of ±10° or better.

The semiconductor-selective polymer that wraps the s-SWCNTs may be present by virtue of a highly selective pre-sorting of the s-SWCNT from a starting sample containing both s-SWCNTs and m-SWCNTs. The semiconductor-selective polymers selectively attach to (e.g., adsorb on) the surfaces of s-SWCNTs relative to the surfaces of m-SWCNTs. This allows for the separation of the selectively wrapped s-SWCNTs from the m-SWCNTS using, for example, centrifugation and filtration. By pre-sorting the SWCNTs to remove m-SWCNTs, films having very high s-SWCNT purity levels can be formed, where s-SWCNT purity level refers to the percentage of SWCNTs in the film that are s-SWCNTs. For example, some of the films formed by the continuous, floating evaporative self-assembly method have an s-SWCNT purity level of at least 99%. This includes films having an s-SWCNT purity level of at least 99.5% and further includes films having an s-SWCNT purity level of at least 99.9%.

A number of semiconductor-selective polymers are known. Description of such polymers can be found, for example, in Nish, A.; Hwang, J. Y.; Doig, J.; Nicholas, R. J. Highly selective dispersion of single-walled carbon nanotubes using aromatic polymers. Nat. Nanotechnol. 2007, 2, 640-6. The semiconductor-selective polymers are typically organic polymers with a high degree of π-conjugation and include polyfluorene derivatives, such as poly(9,9-dialkyl-fluorene) derivatives, and poly(phenyl vinylene) derivatives. While the semiconductor-selective polymers may be conductive or semiconductive polymers, they can also be electrically insulating.

The organic solvent desirably has a relatively low boiling point at the film deposition temperature and pressure, typically ambient temperature and pressure, such that it evaporates rapidly. In addition, it should have the capacity to solubilize the semiconductor-selective-polymer-wrapped s-SWCNTs. Examples of suitable organic solvents include chloroform, dichloromethane, N,N-dimethylformamide, benzene, dichlorobenzene, toluene and xylene.

The puddle of liquid solution that contains the organic solvent and the solvated polymer-wrapped s-SWCNTs has a volume much smaller than that of the bulk liquid medium to which it is delivered. By using very small volumes of solution to deliver the s-SWCNTs to a substrate, the present methods are able to form high density films with very small quantities of SWCNTs and organic solvents, relative to other solution-based SWCNT deposition methods. The concentration of SWCNTs in the flow of liquid that feeds the puddle can be adjusted to control the density of s-SWCNTs along the length of the film. The concentration of s-SWCNTs along the length of the growing film can be the same, or can be different—as in the case of a film having an s-SWCNT concentration gradient along its length. By way of illustration only, the organic solutions used in the present methods may have a SWCNT concentration in the range from about 1 to about 50 µg/ml. However, concentrations outside of this range can be used.

The substrate onto which the films comprising aligned semiconductor-selective-polymer-wrapped s-SWCNTs are deposited are sufficiently hydrophobic that the polymer-wrapped s-SWCNT become adsorbs thereto. The hydrophobic substrates can be composed of a hydrophobic material or can comprise a hydrophobic surface coating over a support substrate. Hydrophobic polymers are examples of materials that can be used as substrate materials, including coatings. If the films are to be used as a channel material in an FET, the substrate can comprise a gate dielectric material, such as $SiO_2$, coated with a hydrophobic coating.

Depending on the intended application of the aligned s-SWCNT films, it may be desirable to define a pattern in the films. For example, the films can be patterned into a series of lines, an array dots, and the like. Therefore, some embodiments of the methods include a post film-growth step in which the films are lithographically patterned using, for example, photolithography techniques. For example, if the films of aligned s-SWCNTs are to be used as the channel material in an FET, a pattern comprising a series of parallel stripes of the aligned s-SWCNTs can be formed in the film.

FETs comprising the films of aligned s-SWCNTs as channel materials generally comprise a source electrode and a drain electrode in electrical contact with the channel material; a gate electrode separated from the channel by a gate dielectric; and, optionally, an underlying support substrate. Various materials can be used for the components of the FET. For example, an FET may includes a channel comprising a film comprising aligned s-SWCNTs, a $SiO_2$ gate dielectric, a doped Si layer as a gate electrode and metal (Pd) films as source and drain electrodes. However, other materials may be selected for each of these components. Channel materials comprising the highly aligned s-SWCNTs having high s-SWCNT purity levels and high SWCNT density are able to provide FETs characterized by both high on-conductance per width ($G_{ON}$/W (µS/µm)) and high on/off ratios. For example, some embodiments of the FETs have an on-conductance per width of at least 5 µS µm$^{-1}$ and an on/off ratio per width of at least $1 \times 10^5$. This includes FETs having on-conductance per width greater than 7 µS µm$^{-1}$ and an on/off ratio per width of at least $1.5 \times 10^5$ and further includes FETs having on-conductance per width greater than 10 µS µm$^{-1}$ and an on/off ratio per width of at least $2 \times 10^5$. These performance characteristics can be achieved with channel lengths in the range from, for example, about 400 nm to about 9 µm, including channel lengths in the range from about 1 µm to about 4 µm.

EXAMPLES

Example 1

In this example, a film comprising aligned s-SWCNTs with exceptional electronic-type purity levels (99.9% s-SWCNTs) were deposited at high deposition velocities using the continuous, floating evaporative self-assembly process. The SWCNTs were made using arc discharge techniques and had diameters in the range from about 13 to about 19 Å.

Substrate Preparation:

Rectangular pieces of silicon (approximately 1 cm wide by 3 cm long) were cut from a larger silicon wafer. These silicon pieces served as the substrates to be coated. The substrates were cleaned by a Piranha solution of $H_2O_2$ (33%)/concentrated $H_2SO_4$ (67%) for about 20 min and rinsed with deionized (DI) water. After Piranha treatment, the substrates were covered by a hexamethyldisilizane self-assembling monolayer (vapor deposition).

s-SWCNT Ink Preparation:

Mixtures of arc-discharge SWCNT powders (2 mg ml$^{-1}$) and poly[(9,9-dioctylfluorenyl-2,7-diyl)-alt-co-(6,6'-{2,2'-bipyridine})] (PFO-BPy) (American Dye Source, 2 mg ml$^{-1}$) were sonicated for 30 min in toluene (30 ml). The solution was centrifuged in a swing bucket rotor at 50,000 g for 5 min, and again at 50,000 g for 1 hr. The supernatant was collected and filtered through a syringe filter. A distillation removed toluene over a 30 min duration. The residue of PFO-BPy and s-SWCNTs were redispersed in tetrahydrofuran (THF). The s-SWCNT solution in THF was centrifuged at a temperature of 15° C. for 12 hours. The supernatant (excess PFO-BPy) was discarded and the pellet was redispersed into THF. After removing the THF, the residue was dispersed in chloroform to a concentration of 20 µg/mL or 10 µg/mL. (Concentrations from 1 to 20 µg/mL were successfully tested.)

Experimental Apparatus:

The substrate was mounted to a motor so that it could be lifted vertically at a uniform speed and then partially submerged in a bath of deionized water. A 20-gauge needle (Hamilton, point style #2—beveled) was used to dispense the s-SWCNT ink into a puddle on the surface of the deionized water. The needle was positioned as follows: at roughly 45° with respect to the surface of the water bath, with the needle's opening facing away from the substrate; the needle's tip was placed in close proximity to the substrate (distances of $40/1000$" to $200/1000$" were successfully tested); and the needle was lowered toward the water until the tip formed a slight dimple in the water surface. (Needles with gauges from 20 to 34 were successfully tested.)

In one experimental run ("Run A"), a wide (~5 cm) piece of thin sheet metal (stainless steel) was partially inserted to form a "dam" behind the needle. A 1 mm spacer between the needle and dam ensured that the fluid supplied by the needle flowed freely onto the water surface. The dam confines the outward (i.e., away from the substrate) flow of the puddle and thereby enables the use of lower ink flow rates to maintain the puddle.

Experimental Procedure:

The s-SWCNT ink was supplied to the puddle in a continuous flow. (Flow rates of 160 to 320 µL/min. were successfully tested.) Simultaneously, the substrate was lifted vertically out of the deionized water and puddle. (Lift rates from 1 to 15 were successfully tested.) The ink flowed across the surface to the substrate, depositing a monolayer CNT film. The substrate was lifted clear of the water bath at the conclusion of the experiment. Further, post-film formation treatments (annealing, etc.) may be desirable depending on the application, but at this point the film deposition was complete.

Two experimental runs were carried out. In the first, Run A, the concentration of SWCNTs in the ink was 20 µg/mL; the needle's tip was placed $40/1000$" from the substrate surface, measured along a line perpendicular to the substrate; the ink was supplied at a flow rate of 200 µL/min; and the substrate was lifted vertically at a rate of 15 mm/min. In the second run, Run B, the concentration of SWCNTs in the ink was 10 µg/mL; the needle's tip was placed $80/1000$" from the substrate surface, measured along a line perpendicular to the substrate; the ink was supplied at a flow rate of 320 µL/min; and the substrate was lifted vertically at a rate of 5 mm/min.

Figure 3:
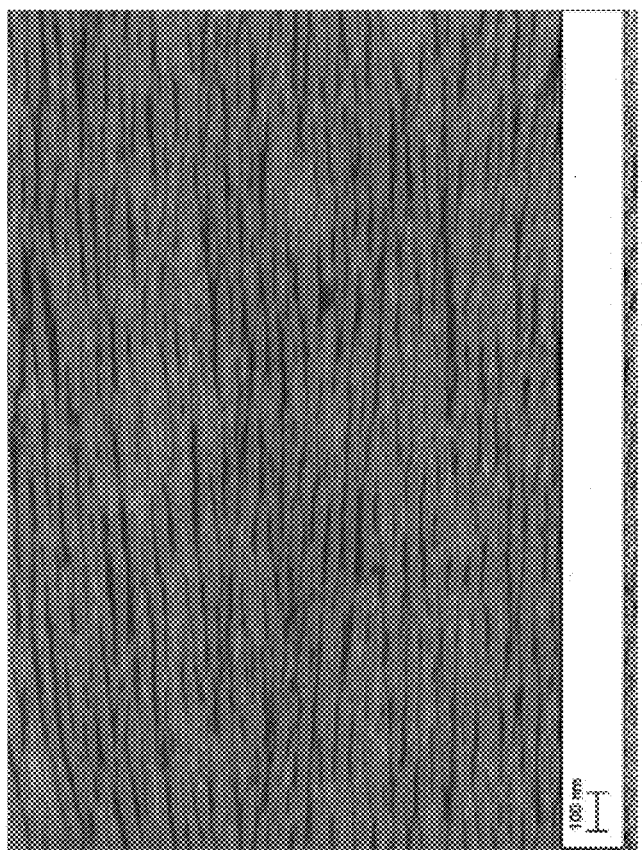
FIG. 3. High resolution SEM image of a first film of aligned s-SWCNTs on a silicon substrate.
Figure 4A:
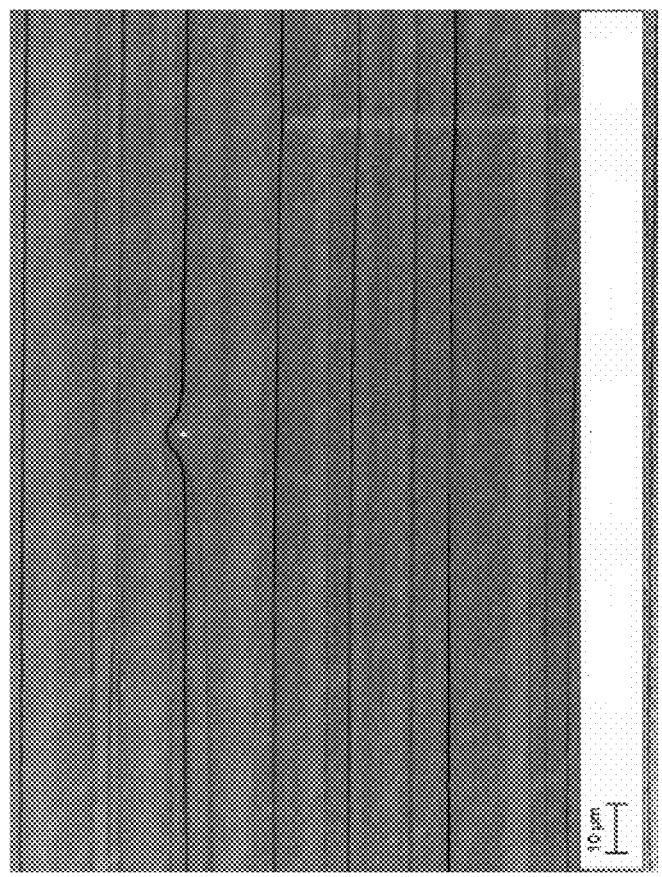
FIG. 4A. High resolution SEM image of a second film of aligned s-SWCNTs on a silicon substrate.
Figure 4B:
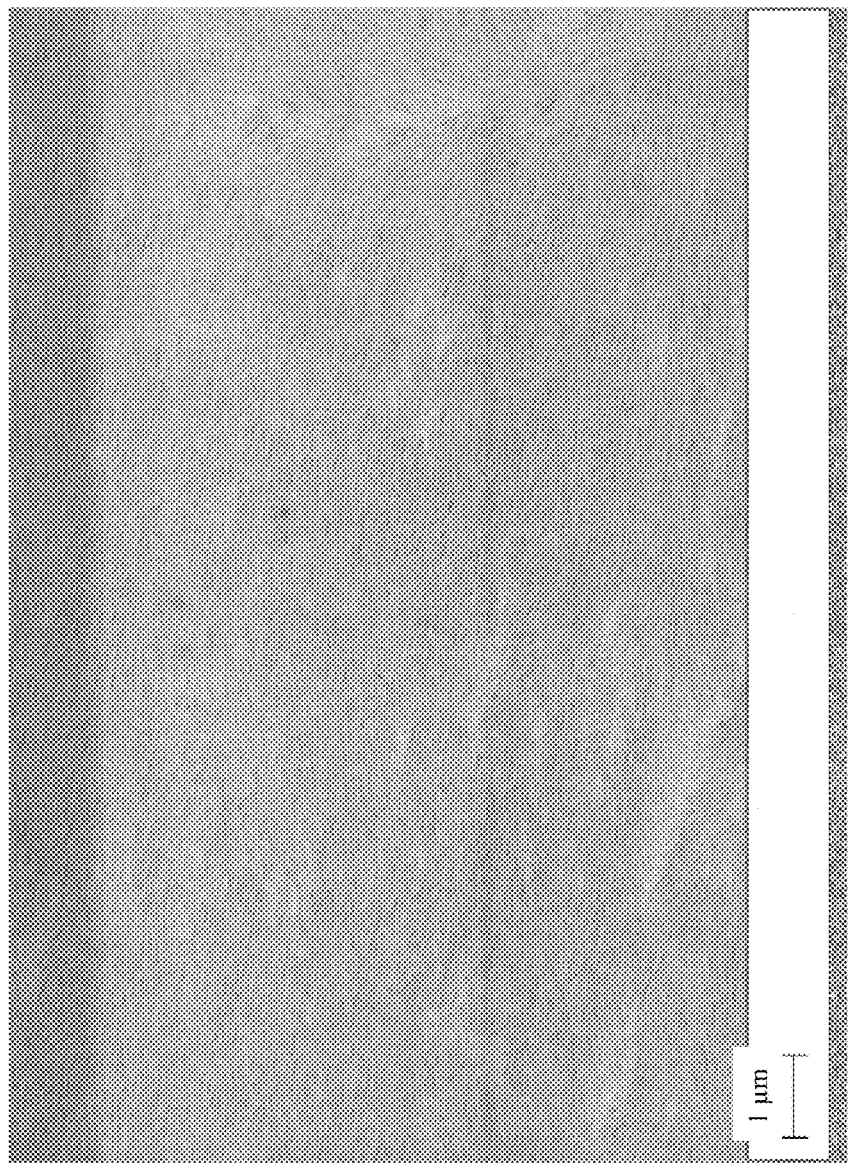
FIG. 4B. High resolution SEM image of an enlarged portion of the SEM image of FIG. 4A.

Film Imaging:

The deposited films were imaged using a LEO 1530 FE-SEM (Field Emission Scanning Electron Microscope). The electron beam was accelerated at 5.0 kilovolts. The working distance was adjusted for best image quality; typically in the range of 3.5 to 6.5 mm. The in-lens secondary electron detector was used to obtain the images. No pretreatment of the samples was used or necessary for imaging by the SEM. FIG. 3 is an SEM image of the aligned s-SWCNT film deposited in Run A. FIG. 4A is an SEM image of the aligned s-SWCNT film deposited in Run B. FIG. 4B shows a magnified portion of the SEM image of FIG. 4A.

Example 2

In this example, a film comprising aligned s-SWCNTs with exceptional electronic-type purity levels (99.9% s-SWCNTs) were deposited at high deposition velocities using the continuous, floating evaporative self-assembly process. The SWCNTs, which are referred to as (7, 5) s-SWCNTs, were made using a procedure similar to that described in Shea, M. J.; Arnold, M. S., *Applied Physics Letters* 2013, 102 (24), 5.

The (7, 5) s-SWCNT were extracted from a powder of small diameter (0.7-1.2 nm) nanotubes (Southwest Nanotechnologies, Lot# SG65i-L38) derived from cobalt molybdenum catalysis of carbon monoxide disproportionation (CoMoCAT). The (7, 5) species were isolated by dispersing the powder in a solution of poly(9,9-dioctylfluorene-2,7-diyl) (PFO) in toluene. The excess PFO was removed by repeated sedimentation and redispersion in tetrahydrofuran, until a solution of less than 2:1 (w/w) PFO:nanotubes was obtained. In the final step to prepare the s-SWCNT ink for continuous FESA deposition, the nanotubes were dispersed in chloroform and diluted to a concentration of 10 µg/mL.

The PFO:(7, 5) nanotubes were deposited onto HMDS treated Si/SiO$_2$ substrates using similar procedures that were used for FESA deposition of the arc discharge nanotubes. A backing dam was not used for this 7, 5 FESA deposition. A 20 gauge needle, 200 µL/min flow rate controlled by syringe pump, and 5 mm/min substrate lift rate were used.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended here and their equivalents.

What is claimed is:

1. A method of forming a film of aligned s-SWCNTs on a substrate, the method comprising:
    (a) partially submerging a hydrophobic substrate in an aqueous medium;
    (b) supplying a continuous flow of a liquid solution to the aqueous medium, the liquid solution comprising semiconductor-selective-polymer-wrapped s-SWCNTs dispersed in an organic solvent, whereby the liquid solution spreads into a layer on the aqueous medium at an air-liquid interface and semiconductor-selective-polymer-wrapped s-SWCNTs from the layer are deposited as a film of aligned semiconductor-selective-polymer-wrapped s-SWCNTs on the hydrophobic substrate, wherein the organic solvent in the layer, which is continuously evaporating, is continuously resupplied by the flow of the liquid solution during the formation of the film; and (c) withdrawing the hydrophobic substrate from the aqueous medium, such that the film of aligned semiconductor-selective-polymer-wrapped s-SWCNTs is grown along the length of the hydrophobic substrate as it is withdrawn from the aqueous medium.

2. The method of claim 1, wherein the organic solvent comprises chloroform.

3. The method of claim 1, wherein the organic solvent comprises at least one of dichloromethane, N,N-dimethylformamide, benzene, dichlorobenzene, toluene and xylene.

4. The method of claim 1, further comprising removing the semiconductor-selective polymer from the aligned semiconductor-selective-polymer-wrapped s-SWCNTs.

5. The method of claim 1, wherein the semiconductor-selective-polymer-wrapped s-SWCNTs in the film have a degree of alignment of about ±20° or better.

6. The method of claim 1, wherein the single-walled carbon nanotube linear packing density in the film is at least 40 single-walled carbon nanotubes/µm.

7. The method of claim 1, wherein the substrate is withdrawn at a rate of at least one mm/min.

8. The method of claim 7, wherein the concentration of s-SWCNTs in the liquid solution is at least 1 µg/mL and the continuous flow of liquid solution is supplied at a rate of at least 160 µL/min.

9. The method of claim 1, wherein the semiconductor-selective polymer is a polyfluorene derivative.

10. A film comprising aligned s-SWCNTs, wherein the s-SWCNTs in the film have a degree of alignment of about ±20° or better and the single-walled carbon nanotube linear packing density in the film is at least 40 single-walled carbon nanotubes/µm.

11. The film of claim 10, wherein the s-SWCNTs in the film have a degree of alignment of ±15° or better and the single-walled carbon nanotube linear packing density in the film is at least 45 single-walled carbon nanotubes/µm.

12. The film of claim 10, having a semiconducting single-walled carbon nanotube purity level of at least 99.9%.

13. The film of claim 10, wherein the s-SWCNTs are wrapped in a semiconductor-selective polymer.

14. The film of claim 13, wherein the semiconductor-selective polymer is a polyfluorene derivative.

15. A field effect transistor comprising:
a source electrode;
a drain electrode;
a gate electrode;
a conducting channel in electrical contact with the source electrode and the drain electrode, the conducting channel comprising a film comprising aligned s-SWCNTs, wherein the s-SWCNTs in the film have a degree of alignment of about ±15° or better and the single-walled carbon nanotube linear packing density in the film is at least 40 single-walled carbon nanotubes/µm; and
a gate dielectric disposed between the gate electrode and the conducting channel.

16. The transistor of claim 15, wherein the film has a semiconducting single-walled carbon nanotube purity level of at least 99.9%.

17. The transistor of claim 15, wherein the s-SWCNTs are wrapped in a semiconductor-selective polymer.

* * * * *